(12) United States Patent
Böttcher

(10) Patent No.: US 11,309,409 B2
(45) Date of Patent: Apr. 19, 2022

(54) PSEUDO SCHOTTKY DIODE

(71) Applicant: NEXPERIA B.V., Nijmegen (NL)

(72) Inventor: Tim Böttcher, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/889,893

(22) Filed: Jun. 2, 2020

(65) Prior Publication Data
US 2021/0028301 A1 Jan. 28, 2021

(30) Foreign Application Priority Data
Jul. 26, 2019 (EP) .................................. 19188648

(51) Int. Cl.
*H01L 29/739* (2006.01)
*H01L 29/66* (2006.01)

(52) U.S. Cl.
CPC .... *H01L 29/7391* (2013.01); *H01L 29/66356* (2013.01)

(58) Field of Classification Search
CPC ........... H01L 29/7391; H01L 29/66356; H01L 29/66136; H01L 29/165; H01L 29/861
See application file for complete search history.

(56) References Cited

U.S. PATENT DOCUMENTS

| | | | |
|---|---|---|---|
| 6,498,367 B1 | 12/2002 | Chang et al. | |
| 2005/0045892 A1* | 3/2005 | Hayashi | H01L 29/7802 257/77 |
| 2008/0050877 A1* | 2/2008 | de Fresart | H01L 29/0634 438/270 |

FOREIGN PATENT DOCUMENTS

| | | |
|---|---|---|
| EP | 0807979 A2 | 11/1997 |
| EP | 1503425 A2 | 2/2005 |
| WO | WO-2009079458 A1 * | 6/2009 ....... H01L 29/66734 |

OTHER PUBLICATIONS

Hurkx et al. "Low-voltage SiGe Power Diodes" Proceedings of the 13 International Symposium on Power Semiconductor Devices and IC's, Jun. 4, 2001 pp. 239-242 IEEE, US.
Extended European Search Report for priority European application No. EP19188648.0, 8 pages, dated Jan. 29, 2020.

* cited by examiner

*Primary Examiner* — Syed I Gheyas
(74) *Attorney, Agent, or Firm* — Ohlandt, Greeley, Ruggiero & Perle, LLP

(57) ABSTRACT

This disclosure relates to a semiconductor device and corresponding method of manufacturing the semiconductor device. The semiconductor device includes a MOS transistor device die and a SiGe diode. The SiGe diode is integrally arranged on the MOS transistor device die, so that the SiGe diode is electrically connected between a source connection and drain connection of the MOS transistor device die.

20 Claims, 5 Drawing Sheets

PSEUDO SCHOTTKY DIODE

CROSS REFERENCE TO RELATED APPLICATION

This application claims the benefit under 35 U.S.C. § 119(a) of European Application No. 19188648.0 filed Jul. 26, 2019 the contents of which are incorporated by reference herein in their entirety.

BACKGROUND OF THE DISCLOSURE

1. Field of the Disclosure

The present disclosure relates to a MOS semiconductor device. In particular this disclosure relates to pseudo Schottky diode and an associated method of manufacture.

2. Description of the Related Art

In metal oxide semiconductor transistor (MOS) devices, the source metallization is often connected both n-type and p-type regions formed in device die to mitigate the effects of a parasitic bipolar transistor caused by a floating p-type region between the n-type source and drain regions. A schematic of a typical MOS transistor 100 is shown in FIG. 1. The body diode 102 is formed between the source (S) and drain (D) terminals. The body diode 102 is formed by the pn junction between the source and drain terminals.

The performance of the body diode 102 is one important parameter of the MOS transistor 100. When forward biased, the body diode 102 is a minority carrier device and therefore has a long recovery time compared to majority carrier devices. During operation of the MOS transistor 100 the body diode 102 may become forward biased and due to the long recovery time minority carriers may become stored in the body diode 102. If during operation the body diode then becomes reverse biased minority carrier stored within the body diode increase the reverse recovery time and transient voltages may also occur. The effects caused by the body diode 102 can therefore result in increased switching times of the MOS device 100. To address the above mentioned problems so-called Pseudo Schottky Diode devices have been developed an example of which is shown in FIG. 2. FIG. 2 shows a cross-sectional view of a known trench gate MOS transistor structure according an embodiment. An n-type silicon (Si) epitaxial layer 202 is formed on an n-type Si substrate 205. Gate trenches 206 may be formed to extend into the n-type epitaxial layer 202 and may be deep or shallow trenches as required. The gate trenches 206 may comprise a gate oxide 208 arranged to line a base and sidewalls of the trenches. A gate material 210 may then be arranged in the gate trenches 206 on the gate oxide 208. A suitable oxide 212 may be arranged on top of the gate arrangement to isolate the gate. A p-type layer 214 is arranged in the n-type epitaxial layer 202. The p-type layer 214 acts as an anode of the body diode and a source of the trench gate MOSFET (reference FIG. 1, illustrating the source S of the MOSFET connected to the p-type anode of the body diode 102). A source contact 216 is arranged to electrically contact to the p-type layer 214 and to electrically contact to a source metallisation 218 (discussed in more detail below).

In the arrangement of FIG. 2 a p-type SiGe layer 204 is then arranged in the n-type layer 202, and contacts the p-type layer 214. The p-type SiGe layer 204 acts as an anode of the SiGe diode, by forming a SiGe p-n junction with the n-type epitaxial layer 202. The p-type SiGe layer 204 is the p-body of the MOS junction, and in this regard it does not amount to an extra diffusion layer.

These devices exhibit a forward voltage behaviour similar to Schottky diodes, but with increased reverse current robustness. Pseudo Schottky Diodes are majority devices and as such exhibit fast reverse recovery times. However, at high current levels the MOS-like majority carrier current, that is the current which forward biases the body pn-junction (typically in the at a forward voltage of 0.7 Volts), is not sufficient to keep the forward bias voltage below the switch-on voltage of the body diode and the body pn-junction contributes to the total current with the injection of minority carriers, so no majority carriers are injected in the pn junction from the p-body. Therefore, a problem with Pseudo Schottky Diodes of the type shown is that minority carriers contribute to the total current and the reverse recovery time increases (that is the reverse recovery time slows) for large current densities sufficient to forward bias the body pn-junction.

SUMMARY

Various example embodiments are directed to issues such as those addressed above and/or others which may become apparent from the following disclosure concerning improving the reverse recovery time in Pseudo Schottky Diodes.

In certain example embodiments, aspects of the present disclosure involves decreasing the switching times in Pseudo Schottky Diodes.

In certain example embodiments the present disclosure involves lowering the forward bias voltage drop under high current density thereby lowering the operating power of the Pseudo Schottky Diodes.

According to an embodiment there is provided a semiconductor device comprising: a MOS transistor device die; and a SiGe diode; wherein the SiGe diode is integrally arranged on the MOS transistor device die, such that the SiGe diode is electrically connected between a source connection and drain connection of the MOS transistor device die.

A gate connection of the MOS transistor device die may be connected to the source connection. The MOS transistor device die may comprise a body diode electrically connected between the source connection and drain connection. The body diode may comprise p-type SiGe semiconductor material and n-type Si semiconductor material. The SiGe diode may comprises a p-type SiGe semiconductor material and an n-type Si semiconductor material.

The p-type SiGe semiconductor material is an epitaxial layer and the n-type Si semiconductor material is an epitaxial layer.

The semiconductor device may further comprise a source metallisation connected to the source connection of the MOS transistor device die and the p-type SiGe semiconductor material of the SiGe diode.

According to an embodiment there is also provided a method of manufacturing a semiconductor device, the method comprising: forming MOS transistor device die; and a SiGe diode; wherein the SiGe diode is integrally formed on the MOS transistor device die, such that the SiGe diode is electrically connected between a source connection and drain connection of the MOS transistor device die.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
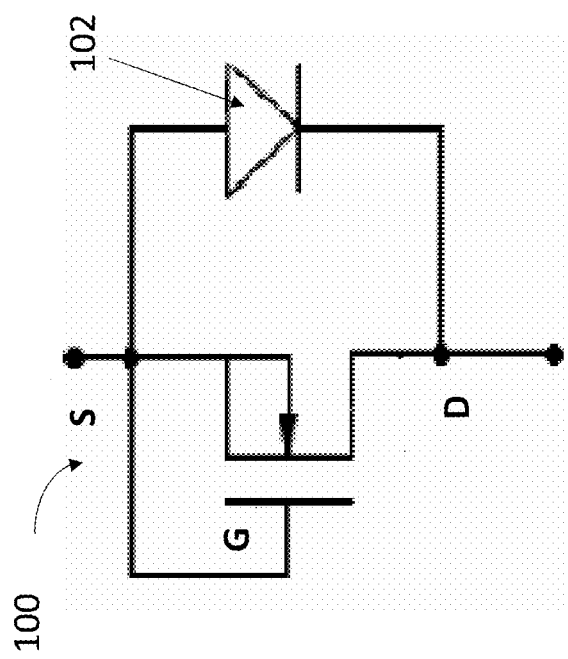
FIG. 1 shows a schematic of a known MOS transistor with the inherent body diode.
Figure 3:
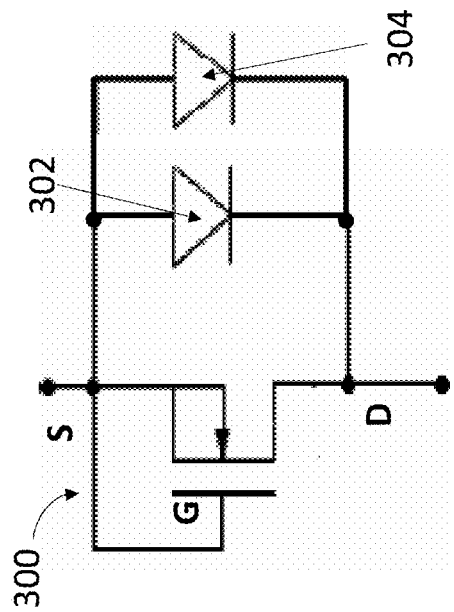
FIG. 3 illustrates a schematic of a MOS transistor diode device with the inherent body diode according to embodiments.

FIG. 3 illustrates a schematic of a MOS transistor device 300 with the inherent body diode 302 according to embodiments. A silicon germanium (SiGe) p-n junction 304 is arranged in parallel with the inherent body diode 302. As discussed in more detail below with respect to FIGS. 4 and 5, the SiGe diode 304 is integrated on the die of the MOS transistor such that it is in parallel with the inherent body diode 302 and the source S and drain D of the MOS transistor.

Figure 4:
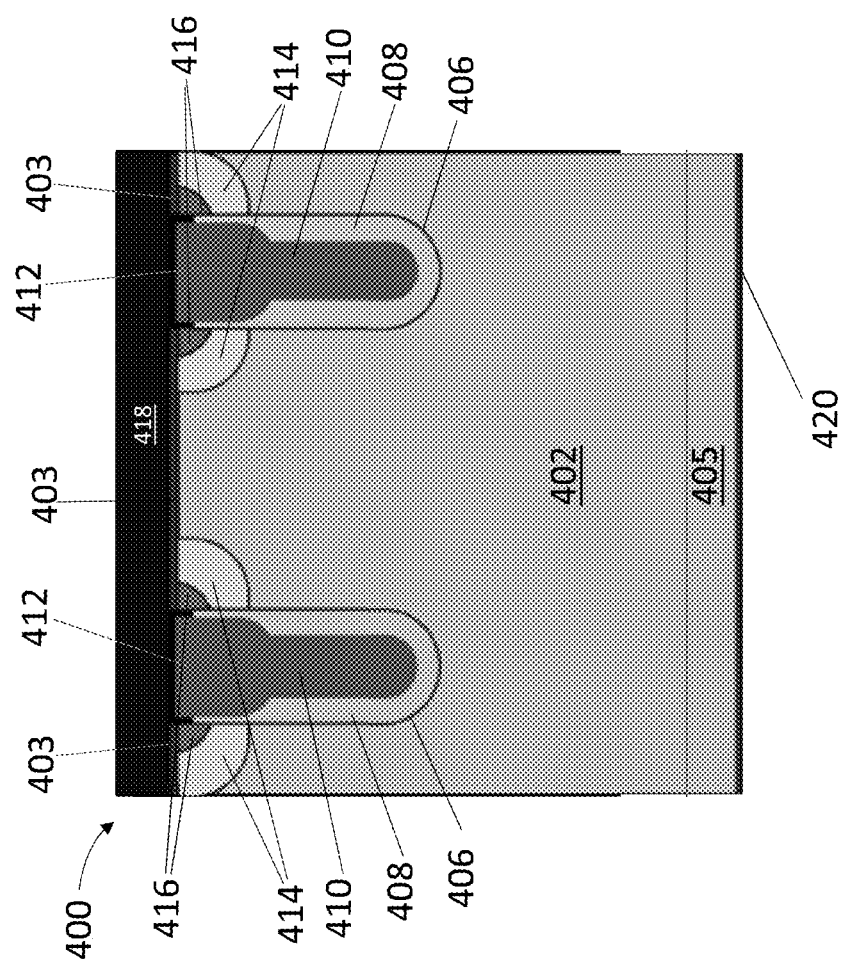
FIG. 4 illustrates a schematic cross-sectional view of a trench gate MOS transistor diode device structure according to an embodiment.

Turning now to FIG. 4, this illustrates a schematic cross-sectional view of a trench gate MOS device structure 400 according to an embodiment. An n-type silicon (Si) epitaxial layer 402 is formed on an n-type Si substrate 405. Gate trenches 406 may be formed in the n-type epitaxial layer 402. The gate trenches 406 may comprise a gate oxide 308 arranged to line the bottom and sidewalls of the gate trenches 406. A gate material 410 may then be arranged in the gate trenches 406 on the gate oxide 308. A suitable further oxide 412 may be arranged on top of the gate material 410 to isolate the source metallisation 418 from the gate material 410. A first p-type layer 414 is arranged in the n-type epitaxial layer 402. The p-type layer 414 acts as an anode of the body diode and a source of the trench gate MOS transistor (reference FIG. 3, illustrating the source S of the MOS device connected to the p-type anode of the body diode 302). A n-type source contact 416 is arranged to electrically contact to the p-type layer 414 and to electrically contact to a source metallisation 418 (discussed in more detail below, thus forming the body diode of the trench gate MOS-diode device structure 400).

A second p-type layer formed of a SiGe layer 403 is then arranged on the n-type layer 402, the p-type layer 414 and the source contact 416 The p-type SiGe layer 403 acts as an anode of the SiGe diode 403, by forming a SiGe p-n junction with the n-type epitaxial layer 402. The SiGe layer 403 is an epitaxially grown layer formed on the n-type silicon (Si) epitaxial layer 402.

The SiGe diode 403, is a majority carrier device, where electron conduction is in the p-type SiGe through the addition of Ge. In the context of the present disclosure therefore, the skilled person will understand that SiGe is preferably formed as p-type and therefore the skilled person will also understand that the term SiGe diode or p-n junction refers to a diode of p-type SiGe and n-type Si The source metallisation 418 forms the source terminal of the MOS transistor 400. Given that the source metallisation 418 is also connected to the p-type SiGe layer 404, this also forms the anode of the SiGe p-n junction, and also the p-type anode of the body diode 414 consistent with the circuit diagram illustrated in FIG. 3. In this way the SiGe p-n junction is in parallel with the body diode, which are both in parallel with the source S and drain D of the MOS transistor. The source metallisation 418 also acts as the gate metallisation, such that the source terminal of the device is connected to the gate terminal of the device, consistent with the arrangement illustrated in FIG. 3. In this way, the MOS transistor 300 is arranged as pseudo Schottky diode.

A drain metallisation 420 may be formed on the bottom surface of the substrate 405, that is on a surface of the substrate opposing the source metallisation 418.

Figure 5:
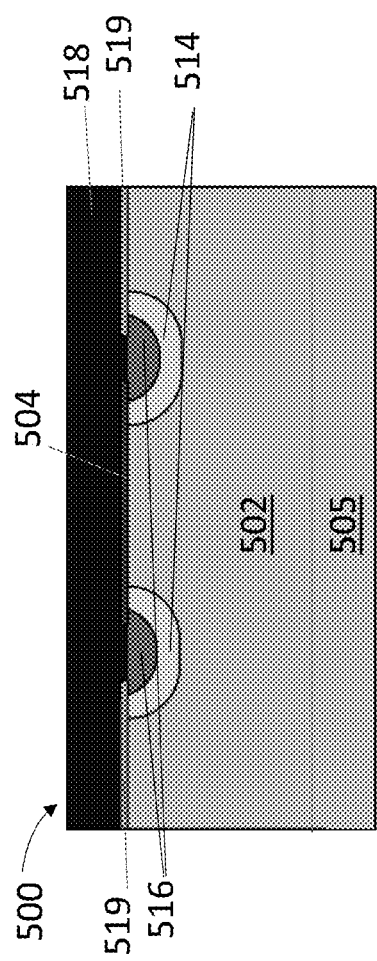
FIG. 5 illustrates a cross-sectional view of a planar MOS transistor diode device structure according an embodiment.

Based on the foregoing, the skilled person will see that the arrangement of the p-type SiGe layer is compatible various MOS transistor layouts. For example, FIG. 5 illustrates a cross-sectional view of a planar MOS transistor structure according an embodiment. An n-type silicon (Si) epitaxial layer 502 is formed on an n-type Si substrate 505.

Figure 2:
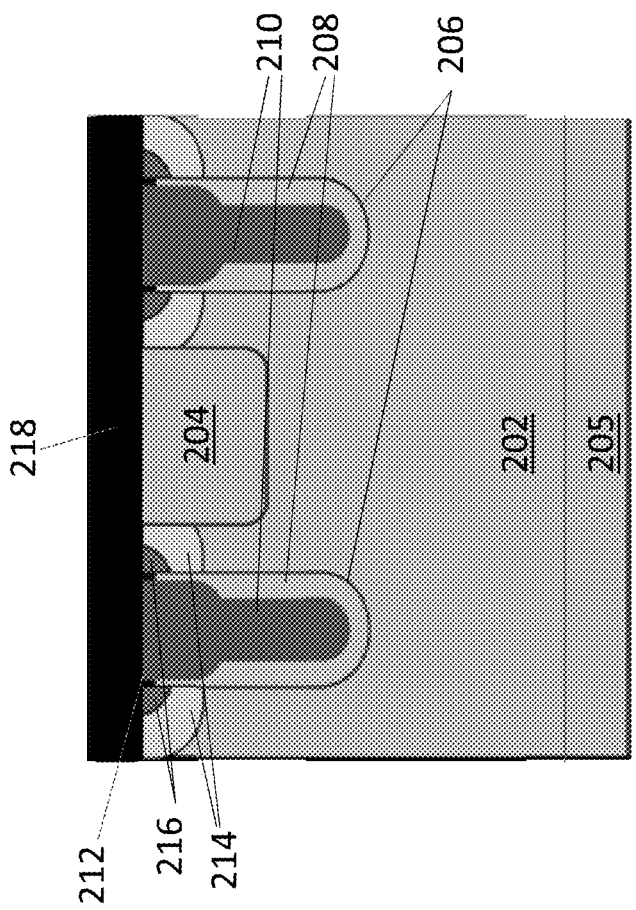
FIG. 2 shows a cross-sectional view of a known trench gate MOS transistor device structure.

A p-type layer 514 is arranged in the n-type epitaxial layer 502. The p-type layer 514 acts as an anode of the body diode and as a body of the trench gate MOS transistor (reference FIG. 2, illustrating the source S of the MOS transistor connected to the p-type anode of the body diode 202). A n-type source contact 516 is arranged to electrically contact to the p-type layer 514 and to electrically contact to a source metallisation 518 (discussed in more detail below).

A p-type SiGe layer 504 is then arranged on the n-type layer 502, the p-type layer 514 and the source contact 516. The p-type SiGe layer 504 acts as an anode of the SiGe diode by forming a SiGe p-n junction with the n-type epitaxial layer 502. As mentioned above with respect to FIG. 4, the skilled person will understand that SiGe is preferably formed as p-type and therefore the skilled person will also understand that the term SiGe diode or p-n junction refers to a diode of p-type SiGe and n-type Si The source metallisation 518 forms the source terminal of the MOS transistor 500. Given that the source metallisation 518 is also connected to the p-type SiGe layer 504, this also forms the anode of the SiGe p-n junction, as illustrated in FIG. 2, and also the p-type anode of the body diode 514. In this way the SiGe p-n junction is in parallel with the body diode, which are both in parallel with the source S and drain D of the MOS transistor. The source metallisation 518 also acts as the gate metallisation 518, such that the source terminal of the device is connected to the gate terminal of the device, consistent with the arrangement illustrated in FIG. 3. In this way, the MOS device 500 is arranged as pseudo Schottky diode. The gate G of the MOS device comprises a gate oxide 519 on which the gate metallisation is arranged.

A drain metallisation 520 may be formed the substrate 505, on a surface thereof opposing the source metallisation 518.

Based on the above described device structures, the skilled person will see that the forward current is dominated by majority carriers because the SiGe p-n junction is a majority carrier device. When the p-n junction starts to conduct electrons are the dominant carrier which results in faster reverse recovery time compared to known devices. The forward voltage of the SiGe diode is lower than the forward voltage of the body diode such that the MOS transistor device, arranged as a pseudo Schottky device (as described above), combined with the SiGe diode can achieve a low forward voltage drop at low and high current densities without the injection of excessive minority carriers, where such injection of minority carriers would otherwise slow the reverse recovery time of the MOS transistor. The Si based pn junction of the body diode is still in place to inject minority carriers under otherwise destructive surge events.

Figure 6:
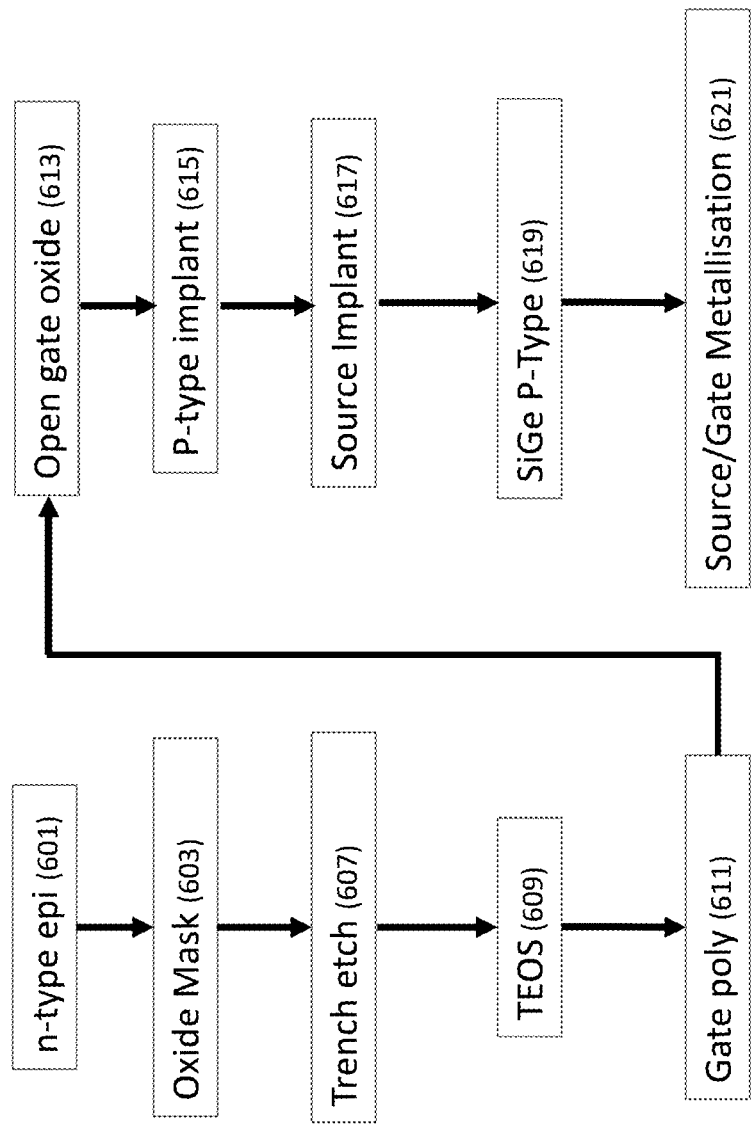
FIG. 6 illustrates a flow diagram of an example process flow for manufacturing of a trench gate MOS transistor diode device according to embodiments.

FIG. 6 illustrates a flow diagram showing example steps for manufacturing the device structure of the type as described above. At step 601 an epitaxial layer of n-type silicon 402, 502 is formed on an n-type silicon substrate 405, 505. At step 603, an oxide mask is arranged on top of the epitaxial layer to define the positions of the trenches 406. In the case of the planar device as illustrated in FIG. 5, the oxide mask may be used to define the position of the p-body implant 514.

At step 607 the epitaxial layer 402 is etched to form the trenches 406 to the required depth. Following formation of the trenches 406, an oxide process (such as a TEOS oxide process) is used at step 609 to create an electrically insulating oxide layer 408 on top of the remaining silicon epitaxial layer 402 and in the trenches 406 (that is formed on the side walls and base of the trenches).

At step 611 a gate material 410, such as polycrystalline silicon, is then deposited in the trenches 406. Dependent on the specific process flow, the details of which are outside the scope of the present disclosure, the gate material 410 and/or the electrically insulating oxide layer 408 may be removed (step 613—open gate oxide), from the top of the epitaxial layer 402 to expose the top surface of the epitaxial layer and a top portion of the trenches 406, by for example etching and/or mechanical planarisation.

The p-type layer 414 is formed by implantation step 615 followed by and the source contact 416 is then formed by implantation step 617.

At step 619 a layer of p-type SiGe semiconductor material 403 is then formed on top surface of the epitaxial layer 402 to contact the p-type layer 414 and the source contact 416. The p-doped SiGe semiconductor material 403 is not formed on the gate material 410. Following formation of the p-type SiGe semiconductor material 403 an appropriate source metallisation 418 is formed, at step 621, of for example TiNi, which is arranged to form gate and contact to the p-type SiGe simultaneously. To achieve a low forward voltage drop in the SiGe diode the p-type SiGe semiconductor material 403 should be at least partially (and preferably fully) strained.

This enables a low-band gap to be achieved. The term "strained" means that the epitaxial layers of semiconductor material have become elastically deformed in order to adapt to the different lattice constant of the underlying substrate without the formation of crystal defects. If the layers are too thick, however, the strain can relax and defects can start to hamper the functionality of the diode. This is because the built-in energy of a layer increases with thickness until it becomes energetically favourable to incorporate defects to release the strain, which also changes the band gap of the silicon germanium. The optimum thickness of the p-type SiGe semiconductor material 403 will depend on the stoichiometry of the p-type SiGe material (for example, the germanium fraction in silicon germanium), but in general for some applications, the combined thickness of the epitaxial layers should not exceed 40 nm. In this respect, the layer of p-type SiGe semiconductor material 403 may have a material thickness of 10-30 nm (in some examples about 20 nm) and the underlying layer of n-doped Si semiconductor material may have a material thickness of no more than 10 nm (in some examples about 5 nm). Consistent with the schematic of FIG. 3, a metallisation step forms a source metal 418 to provide an electrical connection to the source contact 414.

Furthermore, the source metal 418, forms the anode electrical connection to the p-doped SiGe semiconductor material 403 and also connects the source of the MOS transistor device to the p-type SiGe semiconductor material 403. In addition, the source metal 418 also forms the gate contact of the MOS transistor device.

The source metal 418 may comprise one or more of a metal, an alloy (for example, tungsten titanium, titanium nitride and/or tungsten titanium nitride), and a silicide (for example, cobalt silicide, nickel silicide, nickel iron silicide and/or platinum nickel silicide).

The arrangements according to the embodiments of FIGS. 4 and 5 are advantageous because the number of majority carriers in proportion to minority carriers is higher because the p-type SiGe layers 403, 504 contribute to the current at lower forward voltage and at the same time the reverse recovery is much faster.

Particular and preferred aspects of the disclosure are set out in the accompanying independent claims. Combinations of features from the dependent and/or independent claims may be combined as appropriate and not merely as set out in the claims.

Whilst the above process description relates to formation of a trench based device, the skilled person will appreciate that a planar type device, as described above, may be formed by a similar process by omitting the trench formation steps.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:
   a trench gate MOS transistor device die comprising a source connection, a drain connection, an epitaxial layer, a plurality of gate trenches, and a plurality of source contacts adjacent to the plurality of gate trenches;

a body diode, and
a SiGe diode;
   wherein the SiGe diode comprises a SiGe layer integrally arranged on and in direct contact with each of the epitaxial layer, the body diode, and the plurality of source contacts of the MOS transistor device die between the plurality of gate trenches, so that the SiGe diode is electrically connected in parallel with the body diode between a source connection and a drain connection of the MOS transistor device die.

2. The semiconductor device of claim 1, wherein the MOS transistor device die further comprises a gate connection, and wherein the gate connection is connected to the plurality of gate trenches and the source connection.

3. The semiconductor device of claim 1, wherein the MOS transistor device die comprises a body diode electrically connected between the source connection and the drain connection.

4. The semiconductor device of claim 2, wherein the MOS transistor device die comprises a body diode electrically connected between the source connection and the drain connection.

5. The semiconductor device of claim 3, wherein the body diode comprises a p-type SiGe semiconductor material and an n-type Si semiconductor material.

6. The semiconductor device of claim 1, wherein the SiGe diode comprises a p-type SiGe semiconductor material and an n-type Si semiconductor material.

7. The semiconductor device of claim 2, wherein the SiGe diode comprises a p-type SiGe semiconductor material and an n-type Si semiconductor material.

8. The semiconductor device of claim 3, wherein the SiGe diode comprises a p-type SiGe semiconductor material and an n-type Si semiconductor material.

9. The semiconductor device of claim 6, wherein the p-type SiGe semiconductor material is an epitaxial layer.

10. The semiconductor device of claim 9, wherein the n-type Si semiconductor material is an epitaxial layer.

11. The semiconductor device of claim 6, further comprising a source metallisation connected to the source connection of the MOS transistor device die and the p-type SiGe semiconductor material of the SiGe diode.

12. A method of manufacturing a semiconductor device, the method comprising the steps of: forming a MOS transistor device die comprising a source connection, a drain connection, an epitaxial layer, a plurality of gate trenches, a plurality of source contacts adjacent to the plurality of gate trenches, a body diode, and a SiGe diode; wherein the SiGe diode comprises a SiGe layer integrally formed on and indirect contact with each of the epitaxial layer, the body diode, and the plurality of source contacts of the MOS transistor device die between the plurality of gate trenches, so that the SiGe diode is electrically connected between a source connection and a drain connection of the MOS transistor device die.

13. The method of claim 12, wherein the MOS transistor device die further comprises a gate connection that is connected to the plurality of gate trenches and the source connection.

14. The method of claim 12, wherein the MOS transistor device die comprises a body diode electrically connected between the source connection and the drain connection.

15. The method of claim 13, wherein the MOS transistor device die comprises a body diode electrically connected between the source connection and the drain connection.

16. The method of claim 12, wherein the SiGe diode is formed of a p-type SiGe semiconductor material and an n-type Si semiconductor material.

17. The method of claim 13, wherein the SiGe diode is formed of a p-type SiGe semiconductor material and an n-type Si semiconductor material.

18. The method of claim 16, wherein the p-type SiGe semiconductor material is formed of an epitaxial layer.

19. The method of claim 18, wherein the n-type Si semiconductor material is formed of an epitaxial layer.

20. The method of claim 12, further comprising a source metallisation connected to the source connection of the MOS transistor device die and the p-type SiGe semiconductor material of the SiGe diode.

* * * * *